United States Patent
Yu et al.

(10) Patent No.: US 10,340,226 B2
(45) Date of Patent: Jul. 2, 2019

(54) INTERCONNECT CRACK ARRESTOR STRUCTURE AND METHODS

(71) Applicant: Taiwan Semiconductor Manufacturing Company, Ltd., Hsin-Chu (TW)

(72) Inventors: Chen-Hua Yu, Hsin-Chu (TW); Da-Yuan Shih, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/987,491

(22) Filed: Jan. 4, 2016

(65) Prior Publication Data

US 2016/0118351 A1  Apr. 28, 2016

Related U.S. Application Data

(62) Division of application No. 13/370,127, filed on Feb. 9, 2012, now Pat. No. 9,230,932.

(51) Int. Cl.
*H01L 23/49* (2006.01)
*H01L 23/00* (2006.01)

(52) U.S. Cl.
CPC ............ *H01L 23/562* (2013.01); *H01L 24/03* (2013.01); *H01L 24/05* (2013.01); *H01L 24/11* (2013.01);
(Continued)

(58) Field of Classification Search
CPC ............ H01L 21/563; H01L 21/67236; H01L 23/3114; H01L 23/4951; H01L 23/538; H01L 23/5389; H01L 24/01; H01L 24/10; H01L 24/18; H01L 24/82; H01L 2021/60022; H01L 2224/01; H01L 2224/08135; H01L 2224/32135; H01L 2224/82; H01L 23/562; H01L 24/49; H01L 24/14; H01L 24/03; H01L 24/11; H01L 24/16; H01L 24/13; H01L 24/05; H01L 2224/4554; H01L 2224/45124; H01L 24/45; H01L 2224/45144; H01L 2224/45147; H01L 2924/15787;
(Continued)

(56) References Cited

U.S. PATENT DOCUMENTS 4,811,082 A  3/1989  Jacobs et al.
4,990,462 A  2/1991  Sliwa
(Continued)

FOREIGN PATENT DOCUMENTS

CN  1375869 A  10/2002
CN  1499595 A  5/2004
(Continued)

OTHER PUBLICATIONS

Korean Office Action and English Translation, Patent Application No. 10-2012-0135543, dated Oct. 11, 2013, 13 pages.

*Primary Examiner* — Moin H Rahman
(74) *Attorney, Agent, or Firm* — Slater Matsil, LLP

(57) ABSTRACT

A system and method for preventing cracks is provided. An embodiment comprises placing crack stoppers into a connection between a semiconductor die and a substrate. The crack stoppers may be in the shape of hollow or solid cylinders and may be placed so as to prevent any cracks from propagating through the crack stoppers.

20 Claims, 12 Drawing Sheets

(52) U.S. Cl.
CPC ............. *H01L 24/13* (2013.01); *H01L 24/14* (2013.01); *H01L 24/16* (2013.01); *H01L 24/49* (2013.01); *H01L 24/45* (2013.01); *H01L 24/81* (2013.01); *H01L 2224/0345* (2013.01); *H01L 2224/0347* (2013.01); *H01L 2224/0361* (2013.01); *H01L 2224/03452* (2013.01); *H01L 2224/03462* (2013.01); *H01L 2224/0401* (2013.01); *H01L 2224/05012* (2013.01); *H01L 2224/05013* (2013.01); *H01L 2224/05014* (2013.01); *H01L 2224/05015* (2013.01); *H01L 2224/05022* (2013.01); *H01L 2224/05124* (2013.01); *H01L 2224/05147* (2013.01); *H01L 2224/05583* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/114* (2013.01); *H01L 2224/1131* (2013.01); *H01L 2224/1134* (2013.01); *H01L 2224/1145* (2013.01); *H01L 2224/1146* (2013.01); *H01L 2224/1147* (2013.01); *H01L 2224/1161* (2013.01); *H01L 2224/11462* (2013.01); *H01L 2224/11616* (2013.01); *H01L 2224/11825* (2013.01); *H01L 2224/11849* (2013.01); *H01L 2224/13011* (2013.01); *H01L 2224/13012* (2013.01); *H01L 2224/13014* (2013.01); *H01L 2224/1357* (2013.01); *H01L 2224/13076* (2013.01); *H01L 2224/13078* (2013.01); *H01L 2224/13111* (2013.01); *H01L 2224/13124* (2013.01); *H01L 2224/13144* (2013.01); *H01L 2224/13147* (2013.01); *H01L 2224/13155* (2013.01); *H01L 2224/13582* (2013.01); *H01L 2224/13644* (2013.01); *H01L 2224/13655* (2013.01); *H01L 2224/13657* (2013.01); *H01L 2224/13664* (2013.01); *H01L 2224/13671* (2013.01); *H01L 2224/13672* (2013.01); *H01L 2224/1601* (2013.01); *H01L 2224/16237* (2013.01); *H01L 2224/4554* (2013.01); *H01L 2224/45124* (2013.01); *H01L 2224/45144* (2013.01); *H01L 2224/45147* (2013.01); *H01L 2224/81191* (2013.01); *H01L 2224/81193* (2013.01); *H01L 2224/81444* (2013.01); *H01L 2224/81447* (2013.01); *H01L 2224/81455* (2013.01); *H01L 2224/81815* (2013.01); *H01L 2924/15787* (2013.01); *H01L 2924/3512* (2013.01)

(58) Field of Classification Search
CPC ..... H01L 2224/0401; H01L 2924/3512; H01L 24/81; H01L 2224/05012; H01L 2224/11825; H01L 2224/13076; H01L 2224/1161; H01L 2224/114; H01L 2224/05583; H01L 2224/13011; H01L 2224/11616; H01L 2224/13012; H01L 2224/8119; H01L 2224/16237; H01L 2224/1601; H01L 2224/13671; H01L 2224/13664; H01L 2224/13672; H01L 2224/13655; H01L 2224/13644; H01L 2224/13582; H01L 2224/1357; H01L 2224/13155; H01L 2224/13147; H01L 2224/13144; H01L 2224/13124; H01L 2224/13111; H01L 2224/13078; H01L 2224/13014; H01L 2224/11849; H01L 2224/1147; H01L 2224/11462; H01L 2224/1146; H01L 2224/1145; H01L 2224/1134; H01L 2224/1331; H01L 2224/05671; H01L 2224/05666; H01L 2224/05655; H01L 2224/05647; H01L 2224/05644; H01L 2224/05147; H01L 2224/05124; H01L 2224/05022; H01L 2224/05015; H01L 2224/05014; H01L 2224/05013; H01L 2224/0361; H01L 2224/0347; H01L 2224/03462; H01L 2224/03452; H01L 2224/0345; H01L 2224/13657

See application file for complete search history.

(56) References Cited

U.S. PATENT DOCUMENTS

| | | |
|---|---|---|
| 5,075,253 A | 12/1991 | Sliwa |
| 5,186,381 A | 2/1993 | Kim |
| 5,380,681 A | 1/1995 | Hsu |
| 5,466,635 A | 11/1995 | Lynch et al. |
| 5,481,133 A | 1/1996 | Hsu |
| 5,736,456 A | 4/1998 | Akram |
| 5,759,910 A | 6/1998 | Mangold et al. |
| 6,002,177 A | 12/1999 | Gaynes et al. |
| 6,107,164 A | 8/2000 | Ohuchi |
| 6,107,180 A | 8/2000 | Munroe et al. |
| 6,175,161 B1 | 1/2001 | Goetz et al. |
| 6,187,678 B1 | 2/2001 | Gaynes et al. |
| 6,229,216 B1 | 5/2001 | Ma et al. |
| 6,229,220 B1 | 5/2001 | Saitoh et al. |
| 6,232,243 B1 | 5/2001 | Farnworth et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,323,546 B2 | 11/2001 | Hsuan et al. |
| 6,355,501 B1 | 3/2002 | Fung et al. |
| 6,434,016 B2 | 8/2002 | Zeng |
| 6,448,661 B1 | 9/2002 | Kim et al. |
| 6,454,159 B1 | 9/2002 | Takushima |
| 6,461,895 B1 | 10/2002 | Liang et al. |
| 6,562,653 B1 | 5/2003 | Ma et al. |
| 6,562,665 B1 | 5/2003 | Yu |
| 6,570,248 B1 | 5/2003 | Ahn et al. |
| 6,600,222 B1 | 7/2003 | Levardo |
| 6,600,234 B2 | 7/2003 | Kuwabara et al. |
| 6,607,938 B2 | 8/2003 | Kwon et al. |
| 6,661,085 B2 | 12/2003 | Kellar et al. |
| 6,717,245 B1 | 4/2004 | Kinsman et al. |
| 6,756,294 B1 | 6/2004 | Chen et al. |
| 6,762,076 B2 | 7/2004 | Kim et al. |
| 6,762,122 B2 | 7/2004 | Mis et al. |
| 6,790,748 B2 | 9/2004 | Kim et al. |
| 6,887,769 B2 | 5/2005 | Kellar et al. |
| 6,906,418 B2 | 6/2005 | Hiatt et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,960,829 B2 | 11/2005 | Hogerl |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,129,575 B1 | 10/2006 | Lin et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,271,084 B2 | 9/2007 | Jeong et al. |
| 7,276,799 B2 | 10/2007 | Lee et al. |
| 7,279,795 B2 | 10/2007 | Periaman et al. |
| 7,285,867 B2 | 10/2007 | Matsuzaki et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,327,040 B2 | 2/2008 | Aoki et al. |
| 7,345,350 B2 | 3/2008 | Sinha |
| 7,370,411 B2 | 5/2008 | Yamano |

(56) References Cited

U.S. PATENT DOCUMENTS

| | | |
|---|---|---|
| 7,382,049 B2 | 6/2008 | Ho et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,482,703 B2 | 1/2009 | Hwang et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,619,306 B2 | 11/2009 | Kaneko |
| 7,820,543 B2 | 10/2010 | Chang et al. |
| 7,834,450 B2 | 11/2010 | Kang |
| 7,932,601 B2 | 4/2011 | Chang et al. |
| 8,299,616 B2 | 10/2012 | Chuang et al. |
| 8,318,596 B2 | 11/2012 | Kuo et al. |
| 8,456,945 B2 | 6/2013 | Gold et al. |
| 8,492,891 B2 | 7/2013 | Lu et al. |
| 8,546,945 B2 | 10/2013 | Kuo et al. |
| 8,803,319 B2 | 8/2014 | Kuo et al. |
| 8,810,043 B2 | 8/2014 | Nishimura et al. |
| 9,515,036 B2 | 12/2016 | Yu et al. |
| 2002/0132461 A1 | 9/2002 | Kizaki |
| 2003/0107137 A1 | 6/2003 | Stierman et al. |
| 2004/0042190 A1 | 3/2004 | Eng et al. |
| 2005/0026416 A1 | 2/2005 | Cheng |
| 2005/0084989 A1 | 4/2005 | Wakabayashi et al. |
| 2005/0090089 A1 | 4/2005 | Ma et al. |
| 2005/0104222 A1 | 5/2005 | Jeong et al. |
| 2006/0055032 A1 | 3/2006 | Chang et al. |
| 2006/0094224 A1 | 5/2006 | Huang et al. |
| 2006/0108685 A1 | 5/2006 | Tsou et al. |
| 2006/0113681 A1* | 6/2006 | Jeong .................. B23K 3/0607 257/780 |
| 2006/0180887 A1 | 8/2006 | Ono |
| 2006/0207088 A1 | 9/2006 | Yamano |
| 2006/0211233 A1 | 9/2006 | Gan et al. |
| 2006/0289972 A1 | 12/2006 | Nishimura et al. |
| 2007/0029654 A1 | 2/2007 | Sunohara et al. |
| 2007/0032066 A1 | 2/2007 | Yamano |
| 2007/0045840 A1 | 3/2007 | Varnau |
| 2007/0059862 A1 | 3/2007 | Eng et al. |
| 2007/0123022 A1 | 5/2007 | Wakabayashi et al. |
| 2007/0145101 A1 | 6/2007 | Kataoka et al. |
| 2008/0079150 A1* | 4/2008 | Simon ................ H01L 23/3114 257/737 |
| 2008/0093738 A1 | 4/2008 | Lin |
| 2008/0185705 A1 | 8/2008 | Osborn et al. |
| 2008/0296764 A1 | 12/2008 | Chang et al. |
| 2009/0020869 A1 | 1/2009 | Xue et al. |
| 2009/0079070 A1 | 3/2009 | Lin et al. |
| 2009/0096092 A1 | 4/2009 | Patel |
| 2009/0108453 A1 | 4/2009 | Lin et al. |
| 2009/0130840 A1 | 5/2009 | Wang et al. |
| 2009/0174069 A1* | 7/2009 | Nguyen ................ H01L 24/05 257/737 |
| 2009/0197114 A1* | 8/2009 | Shih .................... B23K 1/0016 428/647 |
| 2009/0206480 A1 | 8/2009 | Lam |
| 2011/0057313 A1 | 3/2011 | Chang et al. |
| 2011/0186986 A1 | 8/2011 | Chuang et al. |
| 2011/0193220 A1 | 8/2011 | Kuo et al. |
| 2011/0227216 A1* | 9/2011 | Tseng .................. H01L 24/05 257/737 |
| 2011/0272814 A1* | 11/2011 | Wachtler ........... H01L 23/49816 257/773 |
| 2012/0012997 A1 | 1/2012 | Shen et al. |
| 2012/0067635 A1 | 3/2012 | Nang et al. |
| 2012/0153444 A1 | 6/2012 | Haga et al. |
| 2012/0252168 A1 | 10/2012 | Nah et al. |
| 2012/0309130 A1* | 12/2012 | Hin ...................... H01L 21/568 438/113 |
| 2013/0292827 A1 | 11/2013 | Kuo et al. |
| 2013/0299984 A1 | 11/2013 | Wang et al. |
| 2014/0302669 A1 | 10/2014 | Kuo et al. |

FOREIGN PATENT DOCUMENTS

| | | |
|---|---|---|
| CN | 1750257 A | 3/2006 |
| CN | 1893051 A | 1/2007 |
| DE | 4131413 A1 | 10/1992 |
| JP | 11297873 A | 10/1999 |
| JP | 2000091371 A | 3/2000 |
| JP | 2006287048 A | 10/2006 |
| KR | 100553562 B1 | 2/2006 |
| KR | 1020110091055 A | 8/2011 |
| TW | 586159 | 5/2004 |
| TW | 200524025 | 7/2005 |
| TW | 200816419 | 4/2008 |
| TW | 200820406 | 5/2008 |
| TW | 200832641 | 8/2008 |
| WO | 2011058680 A1 | 5/2011 |

\* cited by examiner

INTERCONNECT CRACK ARRESTOR STRUCTURE AND METHODS

This application is a divisional of U.S. patent application Ser. No. 13/370,127, filed on Feb. 9, 2012, entitled "Interconnect Crack Arrestor Structure and Methods," which application is hereby incorporated herein by reference in its entirety.

BACKGROUND

Generally, a semiconductor die may be bonded to another substrate such as an organic printed circuit board using such technologies as ball grid arrays or controlled collapse chip connection (C4) solder bumps. In one such process, a solder bump may be formed on either the semiconductor die or the substrate or on both using methods such as plating, paste screening or ball mount and then reflowing the solder into a desired bump shape. Once the solder bump has been formed, the contacts on the semiconductor die are aligned with their corresponding contacts on the substrate, with the solder bump located between the contacts. Once aligned, the solder bump is again reflowed and liquefied, wherein the liquefied solder flows and wet onto the contact pads, providing a electrical and physical connection between the semiconductor die and the substrate.

However, a semiconductor die may have a much different coefficient of thermal expansion than the substrate. As such, when the semiconductor die is bonded to the substrate and they are both going through the thermomechanical cyclings which may be used to simulate the system power on and off cycles to meet the JEDEC reliability test requirements, the semiconductor die and the substrate will expand during heating up cycles and contract during cooling down cycles to different lengths. Such an expansion causes stresses to form at the solder joints interconnecting the semiconductor die and the substrate.

This problem is especially prevalent at connections between the semiconductor die and the substrate. In particular, the stresses caused by the mismatch of coefficients of thermal expansion between the semiconductor die and the substrate are so intense that cracks may actually develop in the solder joints interconnecting the semiconductor die and the substrates. These cracks could then propagate through the whole joint and degrade or even destroy the electrical continuity and/or physical connections between the semiconductor die and the substrates. Such destruction may render the parts useless and require a complete refabrication.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a crack stopper for a solder joint between a semiconductor die and a substrate in a wafer level chip scale package, C4 or Package-on-Package (PoP) interconnect structures. The embodiments may also be applied, however, to other bonding processes.

Figure 1A:
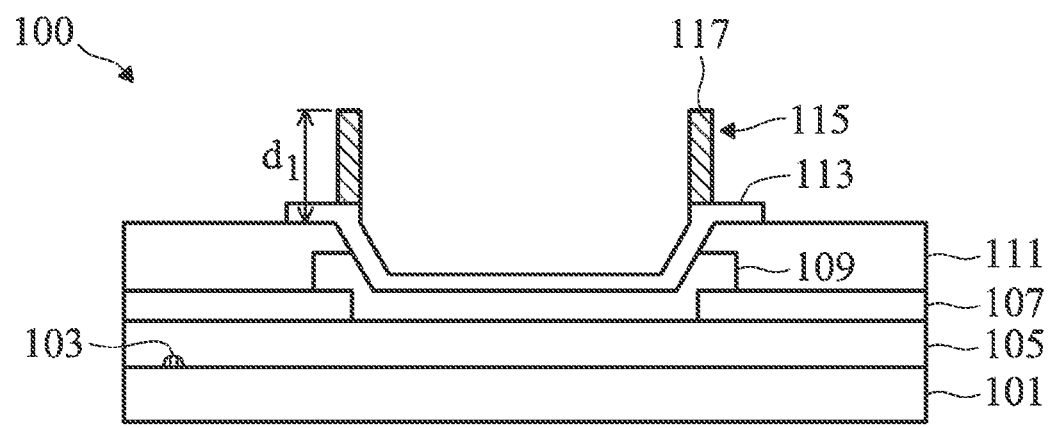
FIGS. 1A-1E illustrate a crack stopper located on a semiconductor die in accordance with an embodiment.

With reference now to FIG. 1A, there is shown a semiconductor IC die 100 with a semiconductor base substrate 101, active devices 103, metallization layers 105, a first passivation layer 107, a first contact pad 109, a second passivation layer 111, an underbump metallization (UBM) 113, and a first crack stopper 115. The semiconductor base substrate 101 may comprise bulk silicon, doped or undoped, or an active layer of a silicon-on-insulator (S 01) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 (only one of which is illustrated in FIG. 1A for clarity) may be formed on the semiconductor base substrate 101. As one of ordinary skill in the art will recognize, the active devices 103 may include a wide variety of active and passive devices such as capacitors, resistors, inductors and the like may be used to generate the desired structural and functional requirements of the design for the semiconductor IC die 100. The active devices 103 may be formed using any suitable methods either within or else on the surface of the semiconductor base substrate 101.

The metallization layers 105 may be formed over the semiconductor base substrate 101 and the active devices 103 and are designed to connect the various active devices 103 to form functional circuitry. While illustrated in FIG. 1A as a single layer, the metallization layers 105 may be formed of alternating layers of dielectric (e.g., low-k dielectric material) and conductive material (e.g., copper) and may be formed through any suitable processes (such as deposition, damascene, dual damascene, etc.). In an embodiment there may be four layers of metallization separated from the semiconductor base substrate 101 by at least one interlayer dielectric layer (ILD), but the precise number of metallization layers 105 is dependent upon the design of the semiconductor IC die 100.

The first passivation layer 107 may be formed on the semiconductor base substrate 101 over the metallization layers 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 µm and about 5 µm, such as about 9.25 KÅ.

After the first passivation layer 107 has been formed, an opening may be made through the first passivation layer 107 by removing portions of the first passivation layer 107 to expose at least a portion of the metallization layers 105. The opening through the first passivation layer 107 allows for contact between the first contact pad 109 and a conductive portion of the metallization layers 105. The opening through the first passivation layer 107 may be formed using a suitable photolithographic masking and etching process, although any suitable process to expose portions of the metallization layers 105 may be used.

The first contact pad 109 may be formed through the opening and over and in electrical contact with a conductive portion of the metallization layers 105. The first contact pad 109 may comprise aluminum, but other materials, such as copper, may alternatively be used. The first contact pad 109 may be formed using a deposition process, such as sputtering, to form a layer of material (not shown) and portions of the layer of material may then be removed through a suitable process (such as photolithographic masking and etching) to form the first contact pad 109. However, any other suitable process may be utilized to form the first contact pad 109. The first contact pad 109 may be formed to have a thickness of between about 0.5 µm and about 4 µm, such as about 1.45 µm.

After the first contact pad 109 has been formed, the second passivation layer 111 may be formed over the first contact pad 109 and the first passivation layer 107. The second passivation layer 111 may be formed from a polymer such as polyimide. Alternatively, the second passivation layer 111 may be formed of a material similar to the material used as the first passivation layer 107, such as silicon oxides, silicon nitrides, low-k dielectrics, extremely low-k dielectrics, combinations of these, and the like. The second passivation layer 111 may be formed to have a thickness between about 2 µm and about 15 µm, such as about 5 µm.

After the second passivation layer 111 has been formed, an opening may be made through the second passivation layer 111 by removing portions of the second passivation layer 111 to expose at least a portion of the underlying first contact pad 109. The opening allows for contact between the first contact pad 109 and the UBM 113 (discussed further below). The opening may be formed using a suitable photolithographic mask and etching process, although any suitable process to expose portions of the first contact pad 109 may be used.

After the opening through the second passivation layer 111 has been formed to expose at least a portion of the first contact pad 109, the UBM 113 may be formed beyond the opening and formed over the second passivation layer 111 and in contact with the first contact pad 109. In an embodiment the UBM 113 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium tungsten/copper/nickel, or an arrangement of titanium/copper/nickel/gold, that are suitable for the formation of the UBM 113. Any suitable materials or combination of different layers of material that may be used for the UBM 113 are fully intended to be included within the scope of the current application.

The UBM 113 may be created by forming each layer over the second passivation layer 111 and the first contact pad 109. The forming of each layer may be performed using a plating process, such as electrochemical plating, although other processes of formation, such as sputtering, evaporation, or PECVD process, may alternatively be used depending upon the desired materials. The UBM 113 may be formed to have a thickness of between about 0.7 µm and about 10 µm, such as about 3 µm. Once the desired layers have been formed, portions of the layers may then be removed through a suitable photolithographic masking and etching process to remove the undesired material and to leave the UBM 113 in a desired shape, such as a circular, octagonal, square, or rectangular shape, although any desired shape may alternatively be formed.

The first crack stopper 115 may be formed over and in physical contact with the UBM 113. The first crack stopper 115 may be placed and shaped in such a fashion as to extend from the UBM 113 and, eventually, into a conductive material 207 (not shown in FIG. 1A but illustrated and discussed below with respect to FIG. 2A). Additionally, the first crack stopper 115 may be placed and shaped in such a fashion as to intercept and stop any cracks that may originate from the edge of the conductive material 207 and prevent the cracks from spreading further into the interior of the conductive material 207.

Figure 1B:
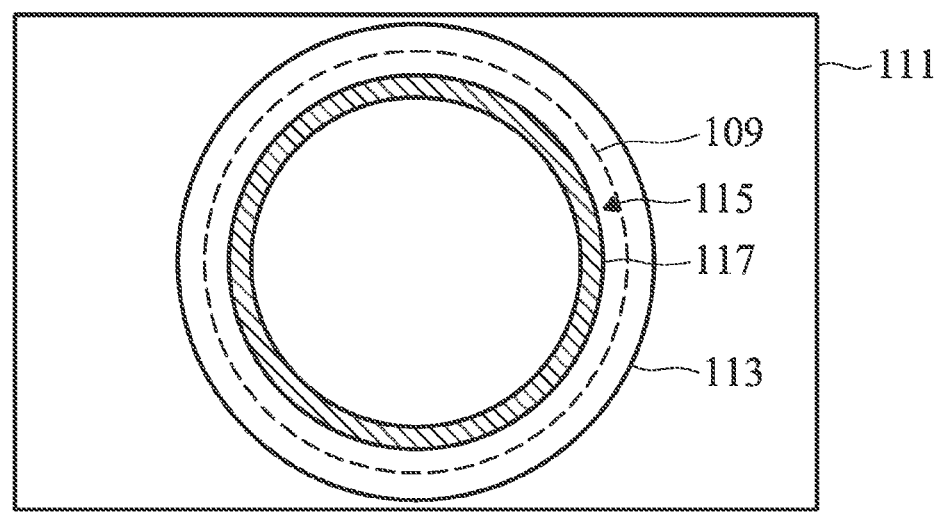

FIG. 1B illustrates one such placement and shape of the first crack stopper 115, in which FIG. 1B is a top-down view of the first crack stopper 115, the UBM 113, and the second passivation layer 111 (with the first contact pad 109 underneath the second passivation layer 111 being illustrated by a dashed line). In this embodiment the first crack stopper 115 may be placed near the outer edge of the UBM 113 and may be shaped in a ring shape such as a first hollow cylinder 117 whose outside edge runs close to the entire outside periphery of the UBM 113. The first hollow cylinder 117 of the first crack stopper 115 in this embodiment may have an outer diameter of less than about 35 microns from the edge of the UBM 113, and may have a wall thickness of less than about 25 µm.

By forming the first crack stopper 115 as the first hollow cylinder 117 around the outside edge of the UBM 113, any cracks that may develop along the outside of the conductive material 207 (not illustrated in FIG. 1 but illustrated and discussed below with respect to FIG. 2) will propagate inwards and encounter the first crack stopper 115 perpendicularly. Such a perpendicular interaction will help prevent the crack from propagating any further into the conductive material 207. In this fashion, the first crack stopper 115 can prevent any crack from degrading the performance of the conductive material 207.

Figure 1C:
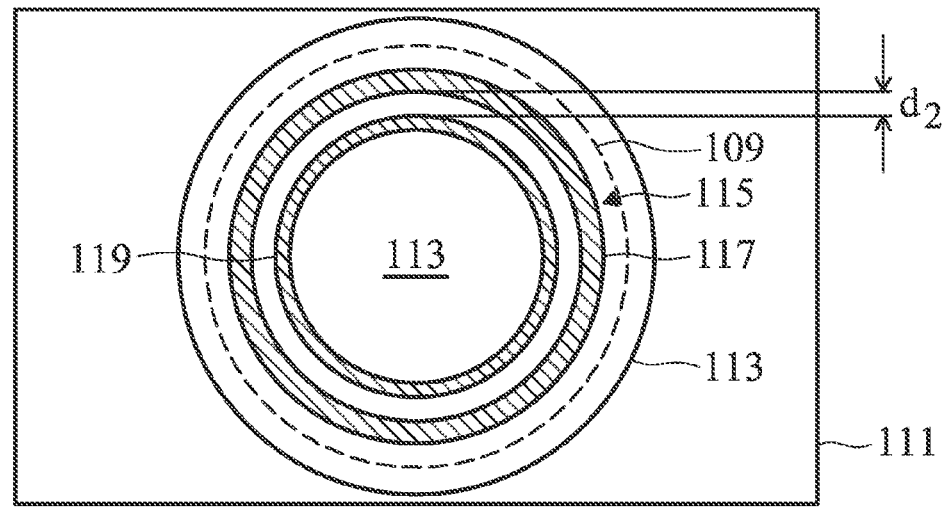
Figure 1D:
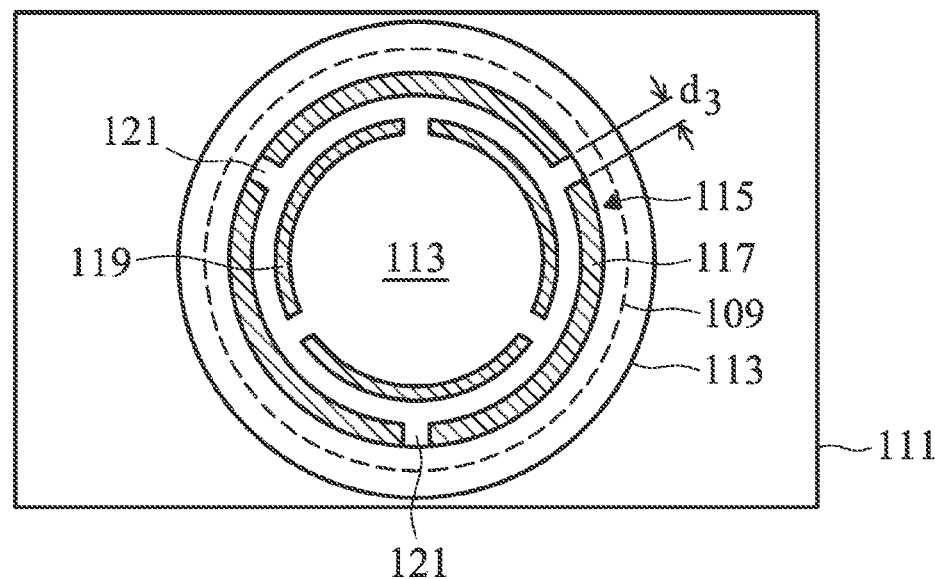
Figure 1E:
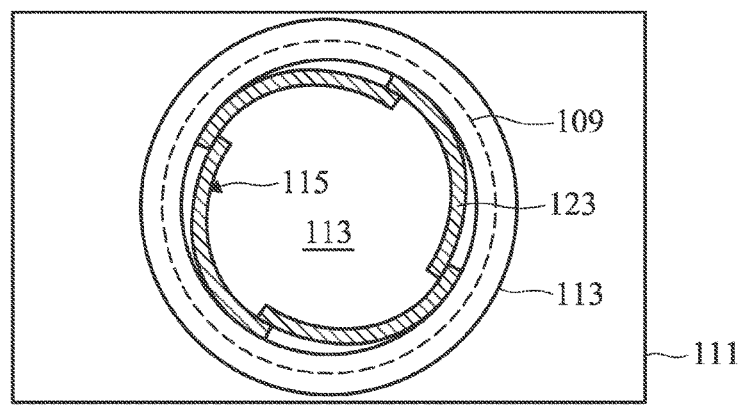

However, the first crack stopper 115 is not intended to be limited to the shape of the first hollow cylinder 117 as described above. FIGS. 1C-1E illustrate other embodiments which may alternately be utilized for the first crack stopper 115. For example, FIG. 1C illustrates an embodiment in which the first crack stopper 115 comprises a second hollow cylinder 119 used in conjunction with the first hollow cylinder 117 in order to prevent the propagation of cracks that may develop. The first hollow cylinder 117 may be similar to the first hollow cylinder 117 described above with respect to FIG. 1B and runs close (e.g., less than 30 microns) to and along the outside edge of the UBM 113. The second hollow cylinder 119 may be located laterally inward from the first hollow cylinder 117 and may have an outer diameter of less than about 65 microns from the outside edge of the UBM 113, and may have a wall thickness of less than about 30 µm. The second hollow cylinder 119 may be separated from the first hollow cylinder 117 a second distance $d_2$ of greater than 10 microns.

By providing the second hollow cylinder 119 in addition to the first hollow cylinder 117, the second hollow cylinder 119 may serve as a back up to the first hollow cylinder 117. As such, if the first hollow cylinder 117 fails to stop the propagation of a crack that has formed, the second hollow cylinder 119 may be able to stop the crack from propagating any further through the conductive material 207. In this fashion, by forming the first crack stopper 115 with the second hollow cylinder 119, the first crack stopper 115 may provide even greater protection against the propagation of cracks through the conductive material 207 and help to prevent device failure.

FIG. 1D illustrates another embodiment in which the first crack stopper 115, instead of having fully intact hollow cylinders as described above with respect to FIG. 1C, has openings 121 included at intervals along the walls of the first hollow cylinder 117 and the second hollow cylinder 119. For example, the first hollow cylinder 117 (in either the embodiment discussed here in FIG. 1D or else in the embodiment discussed above with respect to FIG. 1B) may have three openings 121 (but is not limited to 3) spaced at equidistance intervals around the first hollow cylinder 117. Similarly, the second hollow cylinder 119 may have three openings (but is not limited to 3) 121 also spaced at equidistant intervals around the second hollow cylinder 119, but displaced from the placement of the openings 121 in the first hollow cylinder 117. In an embodiment the openings 121 may have a third distance $d_3$ of between about 5 microns and about 50 microns, such as about 25 microns.

By providing the openings 121 around the first hollow cylinder 117 and the second hollow cylinder 119, the openings 121 may provide a measure of stress relief for the first hollow cylinder 117 and the second hollow cylinder 119. For example, during thermal cycling, when the material of the first hollow cylinder 117 and the second hollow cylinder 119 are expanding, the openings 121 allow the first hollow cylinder 117 and the second hollow cylinder 119 to expand without pushing against another part of the first hollow cylinder 117 or the second hollow cylinder 119, respectively. As such, damage from the stresses caused by this expansion mismatch during the thermomechanical cyclings may be reduced.

FIG. 1E illustrates an embodiment in which the first crack stopper 115 is a broken ring made up of a series of arcs 123. The arcs 123 may be shaped as part of a circle, but may be placed in an overlapping fashion so as to intercept any cracks that originate from the outer edge of the conductive material 207 (not illustrated in FIG. 1E but illustrated and discussed below with respect to FIG. 2). In this embodiment there may be four arcs 123 that may have a thickness of between about 5 microns and about 30 microns, such as about 15 microns.

By forming the first crack stopper 115 in a broken ring configuration, a similar stress relief may be achieved as that described above with respect to FIG. 1D. However, by having the individual arcs 123 overlapping each other, there are no openings 121 through which cracks may be able to propagate. As such, a more efficient arresting of cracks may be achieved, and the damage from cracks may be reduced or eliminated.

However, as one of ordinary skill in the art will recognize, the above described ring shapes are intended to be illustrate examples only and are not intended to limit the embodiments. Other shapes that maintain the basic ring shape but that are not perfectly circle are also fully intended to be included as a ring shape. For example, the first crack stopper 115 may be shaped as an octagon, pentagon, hexagon, and the like, while still maintaining the overall desired ring shape. These and any other suitable ring shapes are fully intended to be included within the scope of the embodiments.

Returning now to FIG. 1A, the first crack stopper 115 may be formed using a masking and plating process in the shapes described above with respect to FIGS. 1B-1E. In an embodiment the first crack stopper 115 may be formed by initially forming a photoresist (not shown) over the second passivation layer 111 to a desired thickness of the first crack stopper 115. The photoresist may be patterned to expose portions of the UBM 113 to which the first crack stopper 115 will extend.

After the photoresist has been patterned, the first crack stopper 115 may be formed within the openings of the photoresist. The first crack stopper 115 may be formed from a conductive material such as copper, although other conductive materials such as nickel, gold, or metal alloys, the like or a combination of them constructed in separate layers may also be used. Additionally, the first crack stopper 115 may be formed using a process such as electroplating, by which an electric current is run through the conductive portions of the UBM 113 to which the first crack stopper 115 is desired to be formed, and the UBM 113 is immersed in a solution. The solution and the electric current deposit, e.g., copper, within the openings in order to fill and/or overfill the openings of the photoresist, thereby forming the first crack stopper 115. Excess conductive material outside of the openings may then be removed using, for example, a chemical mechanical polish (CMP) or wet etching.

After the first crack stopper 115 has been formed, the photoresist may be removed through a process such as dissolving in chemical solution, plasma ashing or other means, whereby the temperature of the photoresist is increased until the photoresist decomposes and may be removed. After the removal of the photoresist, the first crack stopper 115 may extend away from the UBM 113 a first distance $d_1$ of between about 5 µm to about 60 µm, such as 40 µm, although any suitable distance may be used to help prevent the propagation of cracks. Such a distance is beneficial as it will reduce or prevent the crack from detouring around the layer and also prevent it from the consumption of the first crack stopper 115 during subsequent reflow processes.

Optionally, a barrier layer (not shown) may be formed over the first crack stopper 115 in order to help protect the first crack stopper 115. In an embodiment the barrier layer may be formed of nickel, nickel/gold, cobalt, cobalt/gold, vanadium (V)/gold, chromium (Cr)/gold, and combinations thereof, and may be made using a process such as electroless plating. However, any suitable methods and materials may alternatively be utilized for the barrier layer.

However, as one of ordinary skill in the art will recognize, the above described process to form the first crack stopper 115 is merely one such description, and is not meant to limit the embodiments to this exact process. Rather, the described process is intended to be merely illustrative, as any suitable process for forming the first crack stopper 115 may alternatively be utilized. For example, a subtractive etch process may be utilized to form the first crack stopper 115. In an embodiment in which the first crack stopper 115 is formed of a material such as nickel, an initial layer of nickel (not shown in FIG. 1A) may be formed over the second passivation layer 111 and the UBM 113. Once the initial layer of nickel has been formed, the layer of nickel may be patterned using, e.g., a photolithographic masking and etching process which will remove, or subtract, undesired material from the layer of nickel in order to pattern and form the first crack stopper 115 on the UBM 113.

Figure 2A:
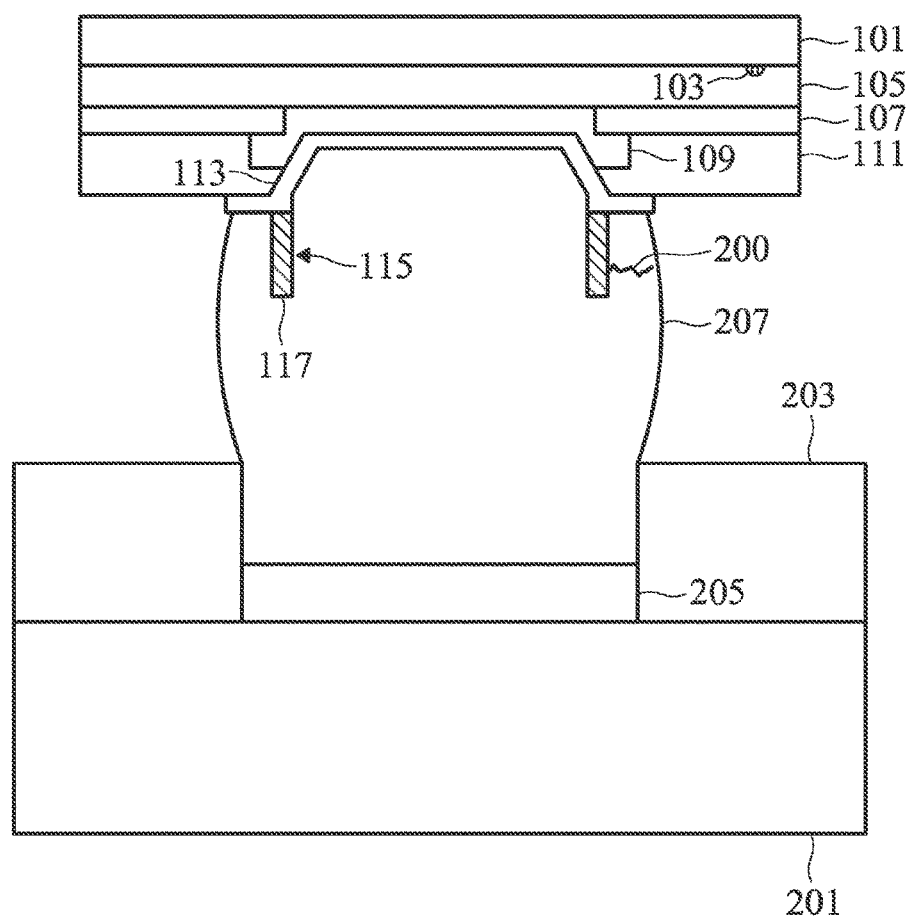
FIGS. 2A-2B illustrate a solder joint interconnecting the semiconductor die to a support substrate in accordance with an embodiment.

FIG. 2A illustrates the placement and bonding of the semiconductor IC die 100 with the first crack stopper 115 onto a support substrate 201. In an embodiment the semiconductor IC die 100 may be bonded to the support substrate 201 in a wafer level chip scale packaging architecture. However, the embodiments are not intended to be limiting to a wafer level chip scale packaging architecture, and may be used for any type of connection.

The support substrate may have a second contact pad 205 and a solder mask 203 formed thereon. The support substrate 201 may be utilized to support and protect the semiconductor IC die 100 while also being used to provide a connection between the first contact pad 109 on the semiconductor IC die 100 to external devices (not shown in FIG. 2A). In an embodiment the support substrate 201 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may alternatively be utilized, and all such redistributive substrates that provide support and connectivity to the semiconductor IC die 100 are fully intended to be included within the scope of the embodiments.

The second contact pad 205 may be formed in a similar fashion and from similar materials as the first contact pad 109. For example, the second contact pad 205 may be formed from copper, nickel, nickel/gold, or the like using a process such as sputtering, electroplating or electroless plating. However, any suitable process for forming the second contact pad 205 may alternatively be utilized.

The solder mask 203 may be formed in order to aid in the formation of the conductive material 207. The solder mask 203 may be formed from a solder mask material, a photoresist, a dielectric material, or a passivation material. In an embodiment in which the solder mask 203 is a photoresist material, the solder mask 203 may be formed by placing the photoresist material onto the support substrate 201 and exposing the solder mask 203 to a radiation such as UV light. The solder mask 203 may then be developed in order to cover the support substrate 201 while exposing the second contact pad 205. Alternatively, in an embodiment in which the solder mask 203 is a dielectric material (such as silicon oxide or silicon nitride) or a passivation material (such as polyimide), the solder mask 203 may be formed over the support substrate 201 and a photolithographic masking and etching process may be utilized to expose a portion of the second contact pad 205.

Once the solder mask 203 has been formed and patterned, conductive material 207 may be formed through the solder mask 203 and in contact with the second contact pad 205. In an embodiment the conductive material 207 may be a solder bump and may comprise a material such as a solder paste, tin, or other suitable materials, such as silver, or copper. In an embodiment in which the conductive material 207 is tin, the conductive material 207 may be formed by initially forming a layer of tin through such commonly used methods such as evaporation, electroplating, paste screening, printing, etc., to a thickness of between about 10 μm and about 100 μm, such as about 50 μm.

Once the conductive material 207 has been formed on the second contact pad 205, a reflow process may be performed to transform the conductive material 207 into a bump shape. In the reflow process the temperature of the conductive material 207 is raised to between about 200° C. and about 260° C., such as about 250° C., for between about 10 seconds and about 60 seconds, such as about 35 seconds. This reflow process partially liquefies the conductive material 207, which then pulls itself into the desired bump shape due to the conductive material's 207 surface tension. The conductive material 207 may have a diameter of between about 210 μm and about 280 μm, such as about 250 μm.

To bond the semiconductor IC die 100 to the support substrate 201, the UBM 113 is aligned with the conductive material 207 and a second reflow process is again performed in order to partially liquefy the conductive material 207 such that it will flow and make contact with the UBM 113. During the reflow process the conductive material 207 will also encapsulate the first crack stopper 115, embedding the first crack stopper 115 within the conductive material 207 after the conductive material 207 hardens back into its solid form.

However, as one of ordinary skill in the art will recognize, the above description presented for the bonding of the semiconductor IC die 100 to the support substrate 201 is merely one illustrative embodiment and is not intended to limit the embodiments in any fashion. Any suitable method for bonding the semiconductor IC die 100 to the support substrate, such as forming the conductive material 207 on the UBM 113 and over the first crack stopper 115 instead of on the second contact pad 205, may alternatively be utilized. These and all such methods of bonding the semiconductor IC die 100 to the support substrate 201 are fully intended to be included within the scope of the embodiments.

With the first crack stopper 115 located within the conductive material 207, any cracks (represented in FIG. 2A by line 200) that may form along the outside edge of the conductive material 207 and that seek to propagate into the interior of the conductive material 207 will instead be intercepted by the first crack stopper 115 and prevented from propagating. By preventing this propagation, defects caused by the crack 200 will be reduced or eliminated, thereby leading to a more resilient and more reliable interconnect.

Figure 2B:
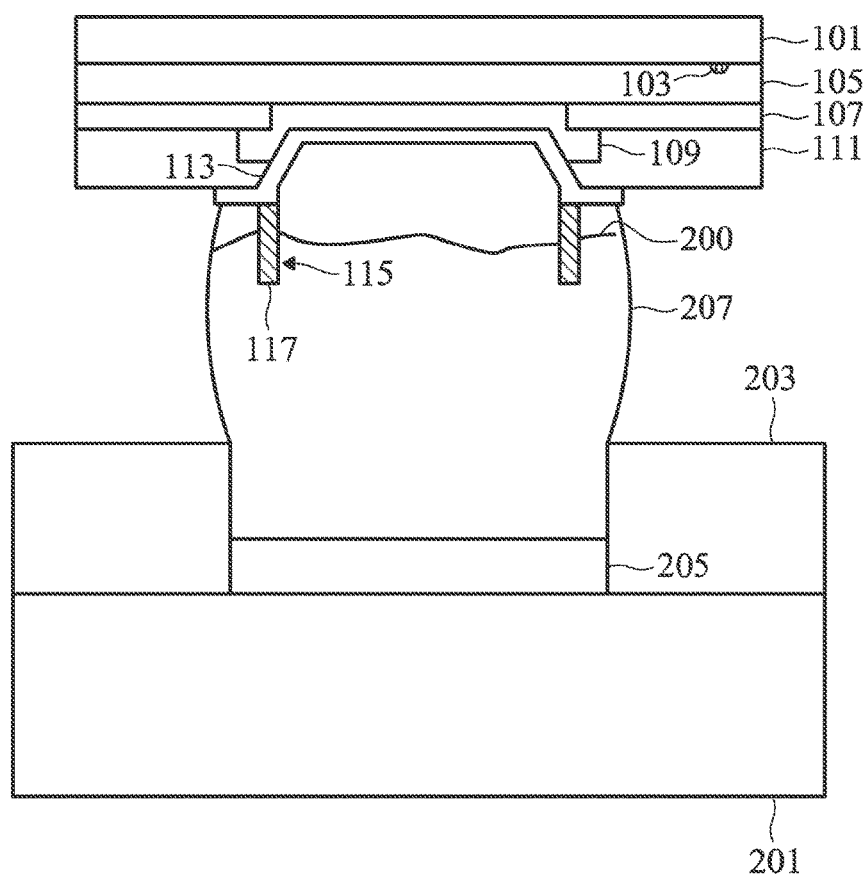

FIG. 2B illustrates a secondary benefit of the first crack stopper 115. In the event that the crack 200 is able to get around or through the first crack stopper 115, it is unlikely that the first crack stopper 115 itself, being made from a stronger material than the conductive material 207, will be damaged. As such, electrical continuity between the UBM 113 and the undamaged portion of the conductive material 207 may be maintained through the first crack stopper 115 itself. Accordingly, even if the conductive material 207 becomes cracked, the first crack stopper 115 may still provide electrical continuity between the semiconductor IC die 100 and the support substrate 201 across the crack 200.

Figure 3A:
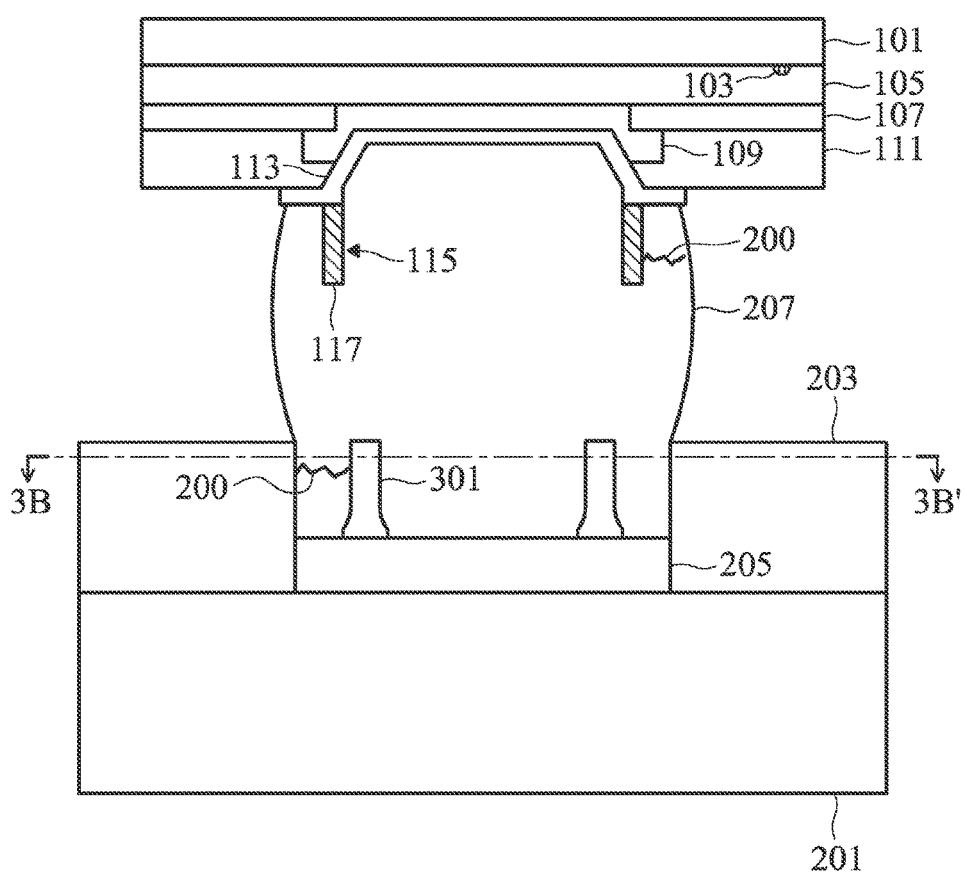
FIGS. 3A-3B illustrate another embodiment in which a crack stopper is also formed on the support substrate in accordance with an embodiment.

FIG. 3A illustrates another embodiment in which a second crack stopper 301 may be formed on the second contact pad 205. By placing the second crack stopper 301 on the second contact pad 205, the second crack stopper 301 may work together with the first crack stopper 115 (located on the UBM 113) to prevent the propagation of cracks 200 that may form within the conductive material 207. In an embodiment the second crack stopper 301 may be formed, placed, and shaped on the second contact pad 205 in order to reduce or prevent the propagation of cracks 200 that may develop in the conductive material 207 adjacent to the edges of the second contact pad 205. In an embodiment and as shown in FIG. 3A, the second crack stopper 301 may be formed using a subtractive etch process, although any other suitable process (such as the processes described above with respect to the first crack stopper 115), may alternatively be utilized to form the second crack stopper 301.

Figure 3B:
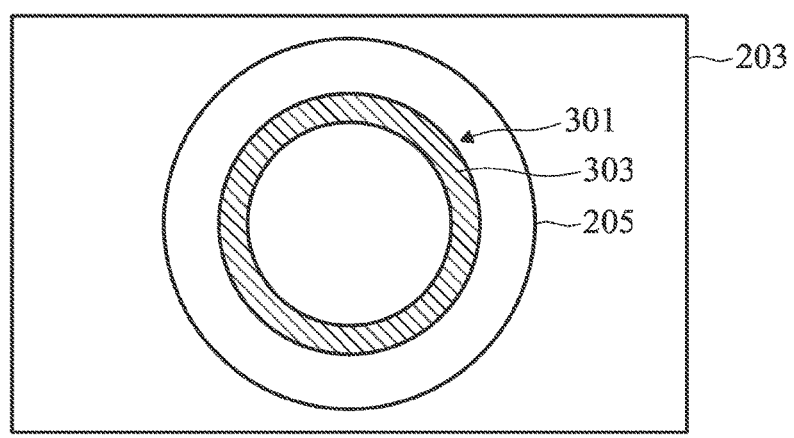

FIG. 3B, illustrating a top down view of FIG. 3A along line 3B-3B', illustrates that the second crack stopper 301 may be formed similar to the first crack stopper 115 and may be, for example, in the shape of a third hollow cylinder 303 when viewed from the top. In an embodiment the third hollow cylinder 303 may have a similar shape and be formed with a similar process and materials as the first hollow cylinder described above with respect to FIGS. 1A-1B. However, similar to the first crack stopper 115, the second crack stopper 301 may alternatively be any suitable shape, such as a double hollow cylinder, a double solid cylinder, a solid cylinder, a hollow cylinder with openings within the outer wall, a broken ring, combinations of these, or the like. Any suitable shape that may be utilized to work in conjunction with the first crack stopper 115 and help reduce or prevent the propagation of cracks that may be formed adjacent to the second contact pad 205 may alternatively be used and are fully intended to be included within the scope of the embodiments.

Figure 4A:
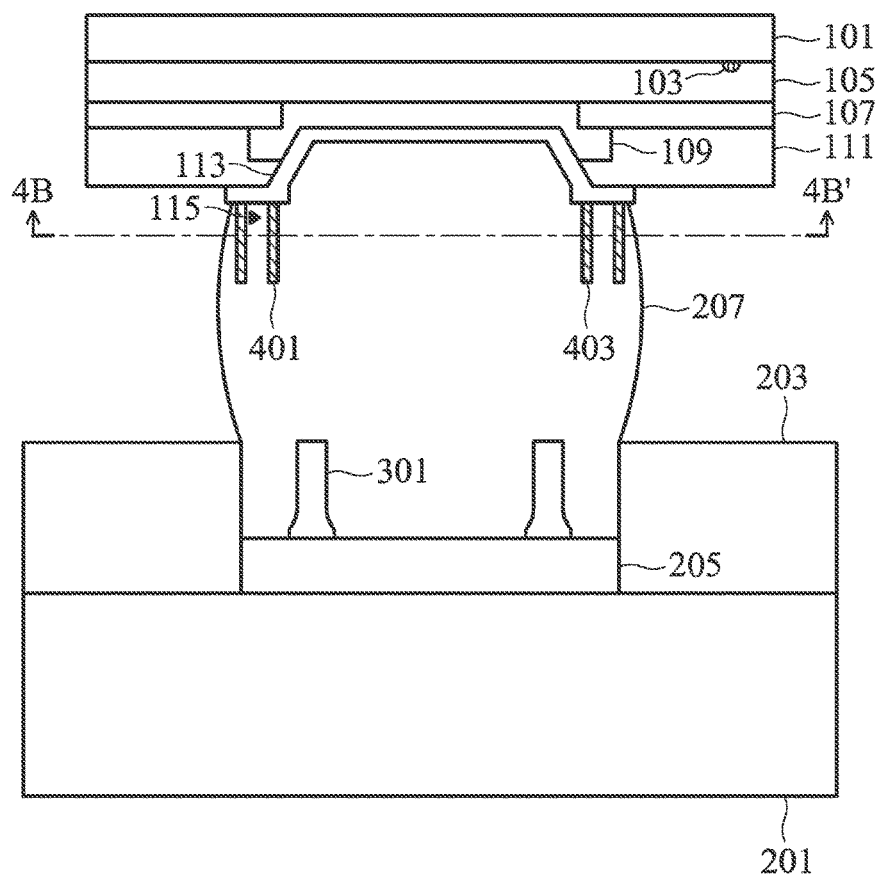
FIGS. 4A-4C illustrate another embodiment in which the crack stopper is in the shape of multiple cylinders in accordance with an embodiment.
Figure 4B:
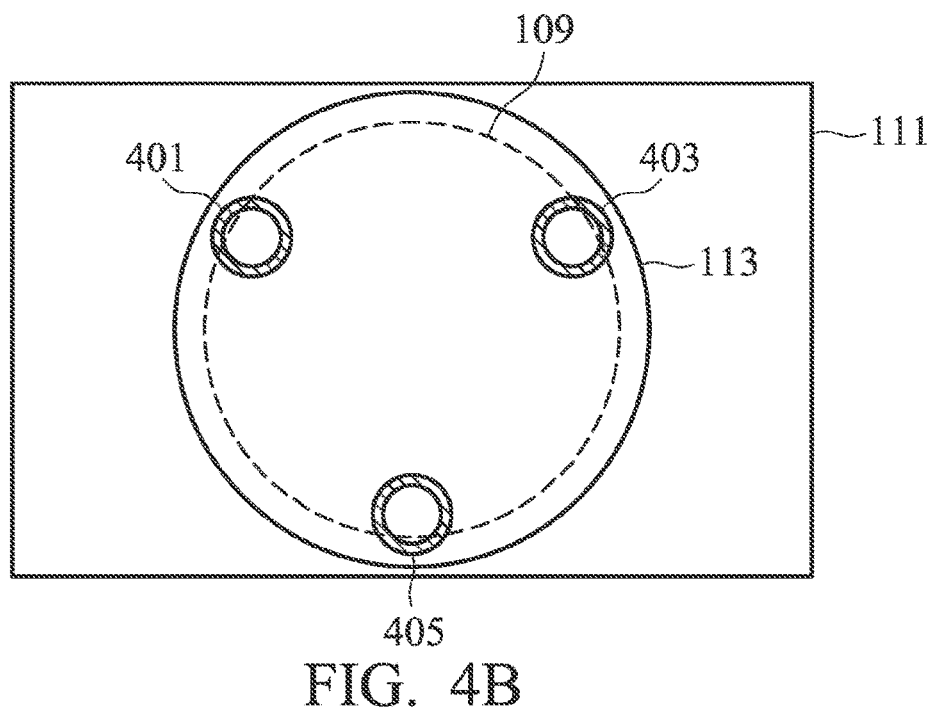
Figure 4C:
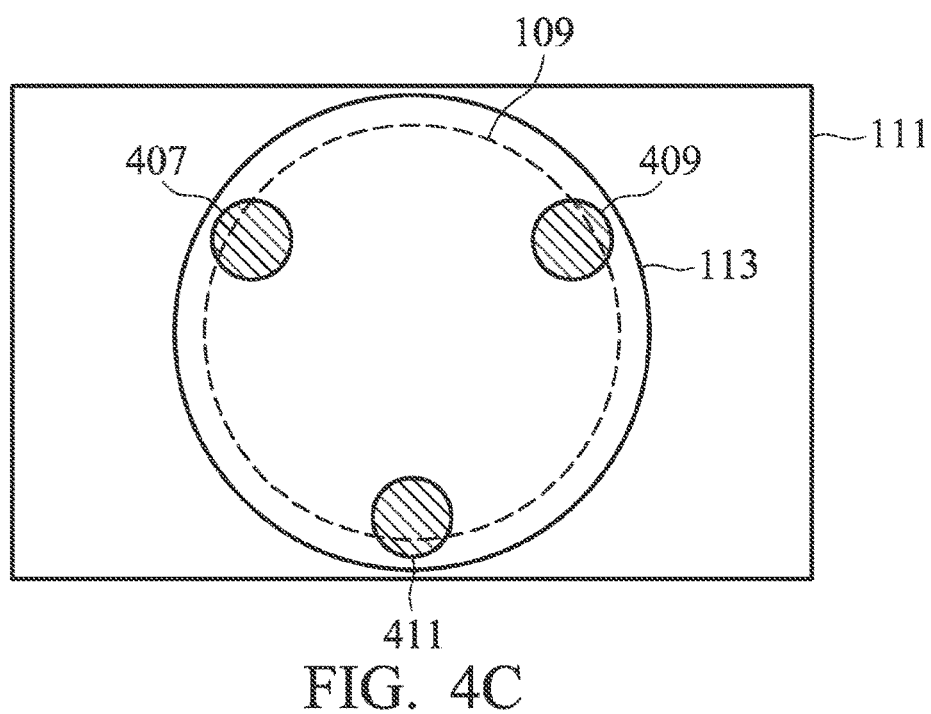

FIGS. 4A-4C illustrate yet another embodiment in which the first crack stopper 115 is formed not in the shape of one or more hollow cylinders (as illustrated above with respect to FIGS. 1A-3B) embedded within each other, but are formed in the shape of one or more hollow or solid cylinders or mixture of solid and hollow cylinders separated from each other. For example, FIGS. 4A and 4B, wherein FIG. 4B is a plan view of FIG. 4A along line 4B-4B', illustrate an embodiment in which multiple hollow cylinders (such as a fourth hollow cylinder 401, a fifth hollow cylinder 403, and a sixth hollow cylinder 405 as illustrated in FIG. 4B) are spaced apart from each other on the UBM 113. In this embodiment the fourth hollow cylinder 401, the fifth hollow cylinder 403, and the sixth hollow cylinder 405 may each have an outer diameter of between about 15 microns and about 60 microns, such as about 30 microns, and an inner diameter of between about 5 microns and about 20 microns, such as about 10 microns. Additionally, the individual hollow cylinders may be spaced equidistant from each other along the exterior of the UBM 113.

The fourth hollow cylinder 401, the fifth hollow cylinder 403, and the sixth hollow cylinder 405 may be formed using a process similar to the formation of the first crack stopper 115 described above with respect to FIG. 1A. For example, the first crack stopper 115 may be formed using, e.g., a masking and electroplating process, a wire bonding process, or a subtractive etching process. Any suitable process may be utilized to form the fourth hollow cylinder 401, the fifth hollow cylinder 403, and the sixth hollow cylinder 405.

However, as one of ordinary skill in the art will recognize, while the embodiment of the fourth hollow cylinder 401, the fifth hollow cylinder 403, and the sixth hollow cylinder 405 spaced equidistance around the UBM 113 as described above is one suitable embodiment, the embodiments are not limited to the precise number and layout as described. Rather, the first crack stopper may be made up of any suitable number of cylinders. Additionally, these cylinders may be arranged in any fashion near the outer edge of the UBM 113. All such combinations of numbers and arrangement are fully intended to be included within the scope of the embodiments.

FIG. 4C illustrates another embodiment in which the fourth hollow cylinder 401, the fifth hollow cylinder 403, and the sixth hollow cylinder 405 described above in FIG. 4B are replaced by a first solid cylinder 407, a second solid cylinder 409, and a third solid cylinder 411. By forming solid cylinders instead of hollow cylinders, the ability of the first crack stopper 115 to stop the propagation of cracks is enhanced by utilizing the first solid cylinder 407, the second solid cylinder 409, and the third solid cylinder 411, each having greater internal support for stopping the propagation of cracks. The first solid cylinder 407, the second solid cylinder 409, and the third solid cylinder 411 may be placed in a similar fashion as the fourth hollow cylinder 401, the fifth hollow cylinder 403, and the sixth hollow cylinder 405 described above with respect to FIG. 4B, or may alternatively be placed in another pattern.

Additionally, any suitable combination of hollow and solid cylinders may also be utilized. For example, the fourth hollow cylinder 401 and the fifth hollow cylinder 403 may be utilized along with the third solid cylinder 411 in order to provide resistance to the propagation of cracks. This combination and any other suitable combination of solid and hollow cylinders may be used, and all such combinations are fully intended to be included within the scope of the present embodiments.

Figure 5A:
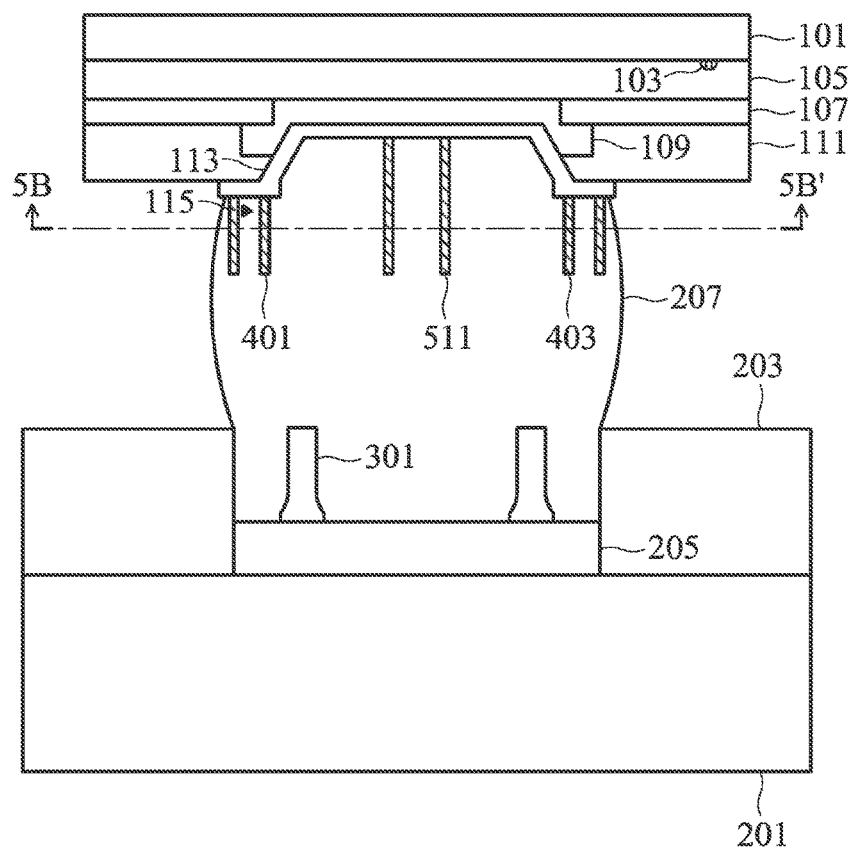
FIG. 5A-5C illustrate yet another embodiment in which the crack stopper is multiple cylinders arranged along an exterior and an interior of contact pads on either or both the semiconductor die and substrate in accordance with an embodiment.
Figure 5B:
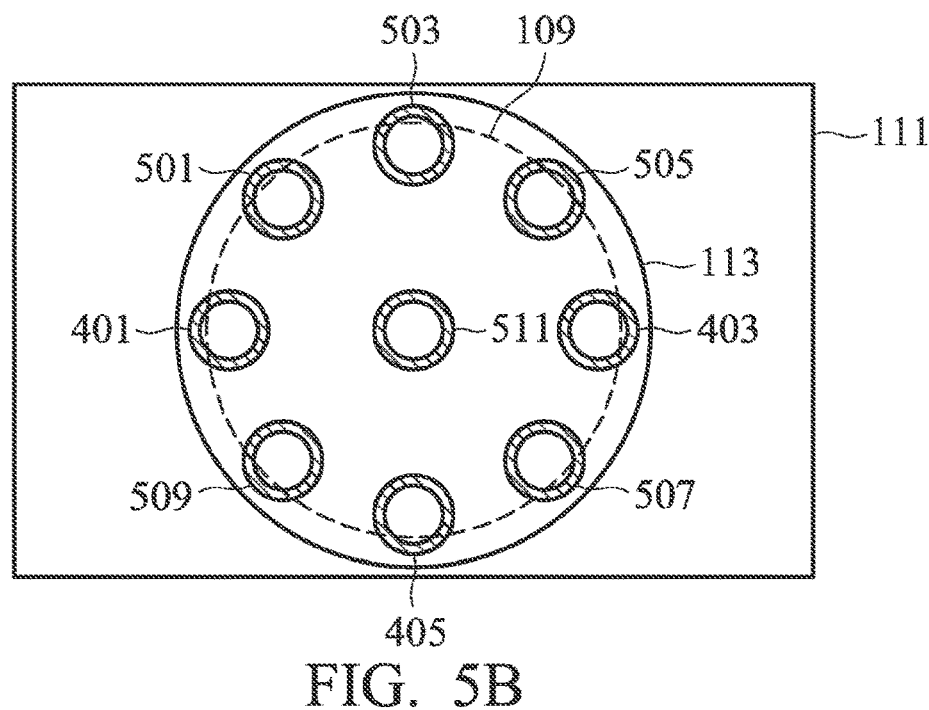

FIGS. 5A-5B illustrate yet another embodiment utilizing multiple hollow cylinders that are separated from each other, with FIG. 5B illustrating a plan view of FIG. 5A along line 5A-5A'. In this embodiment the fourth follow cylinder 401, the fifth hollow cylinder 403, and the sixth hollow cylinder 405 are utilized along with seventh hollow cylinder 501, an eighth hollow cylinder 503, a ninth hollow cylinder 505, a tenth hollow cylinder 507, and an eleventh hollow cylinder 509, and these hollow cylinders are arranged along an outside edge of the UBM 113. Additionally, a twelfth hollow cylinder 511 may be located within a center region of the UBM 113. By placing the twelfth hollow cylinder 511 within a center region of the UBM 113, the hollow cylinders placed near the exterior edge of the UBM 113 may be utilized to intercept any cracks that may form along the exterior edge, and the twelfth hollow cylinder 511 located within the center region of the UBM 113 may be utilized to intercept any cracks that propagate between the hollow cylinders located around the exterior edge of the UBM 113. As such, the combination of the exterior hollow cylinders and the twelfth hollow cylinder 511 may be used to reduce or prevent the propagation of cracks prior to the cracks propagating all the way through the conductive material 207.

The seventh hollow cylinder 501, the eighth hollow cylinder 503, the ninth hollow cylinder 505, the tenth hollow cylinder 507, and the eleventh hollow cylinder 509 may be formed similar to the fourth hollow cylinder 401, the fifth hollow cylinder 403, and the sixth hollow cylinder 405 described above with respect to FIG. 4A-4B. For example, the seventh hollow cylinder 501, the eighth hollow cylinder 503, the ninth hollow cylinder 505, the tenth hollow cylinder 507, and the eleventh hollow cylinder 509 may be formed using, e.g., a masking and electroplating process, a wire bonding process, or a subtractive etching process. Any suitable process may be utilized to form the seventh hollow cylinder 501, the eighth hollow cylinder 503, the ninth hollow cylinder 505, the tenth hollow cylinder 507, and the eleventh hollow cylinder 509.

Figure 5C:
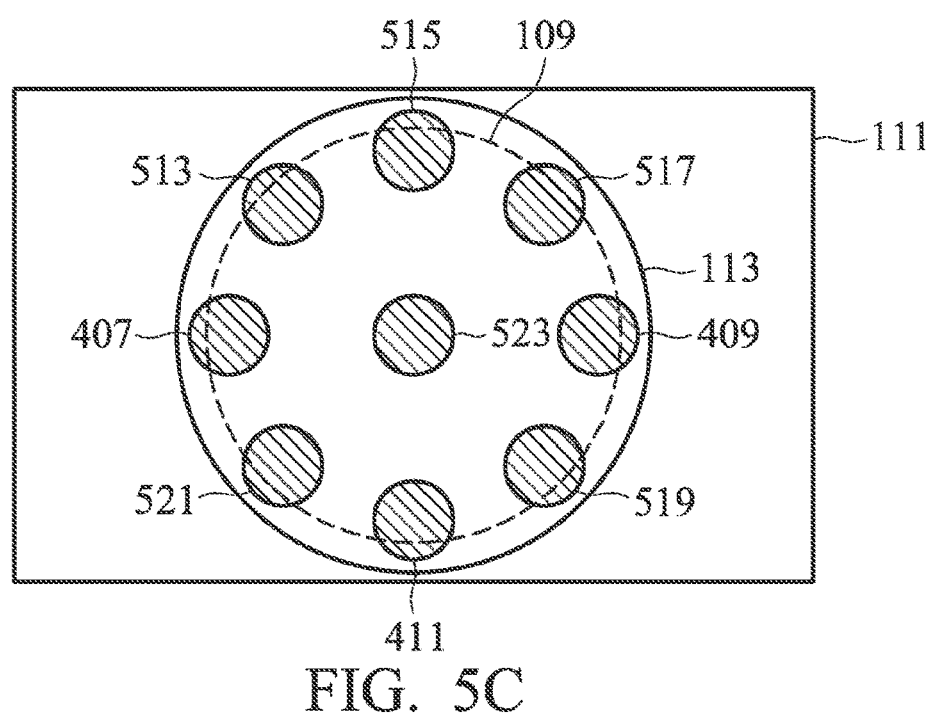

FIG. 5C illustrates a similar embodiment in which the first solid cylinder 407, the second solid cylinder 409, and the third solid cylinder 411 are used in conjunction with a fourth solid cylinder 513, a fifth solid cylinder 515, a sixth solid cylinder 517, a seventh solid cylinder 519, and an eighth solid cylinder 521 and are arranged in a ring along the exterior region of the UBM 113. Additionally, a ninth solid cylinder 523 may be placed into the center region of the UBM 113 in order to intercept any cracks that may propagate through the ring of solid cylinders in the outer region of the UBM 113.

Figure 6A:
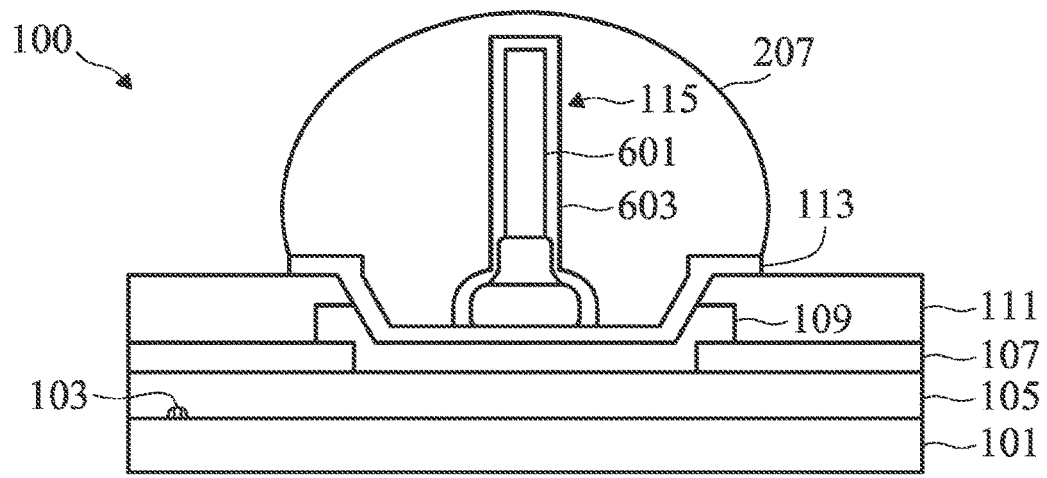
FIGS. 6A-6B illustrate yet another embodiment in which the crack stopper is one or more wires bonded to the semiconductor die in accordance with an embodiment.
Figure 6B:
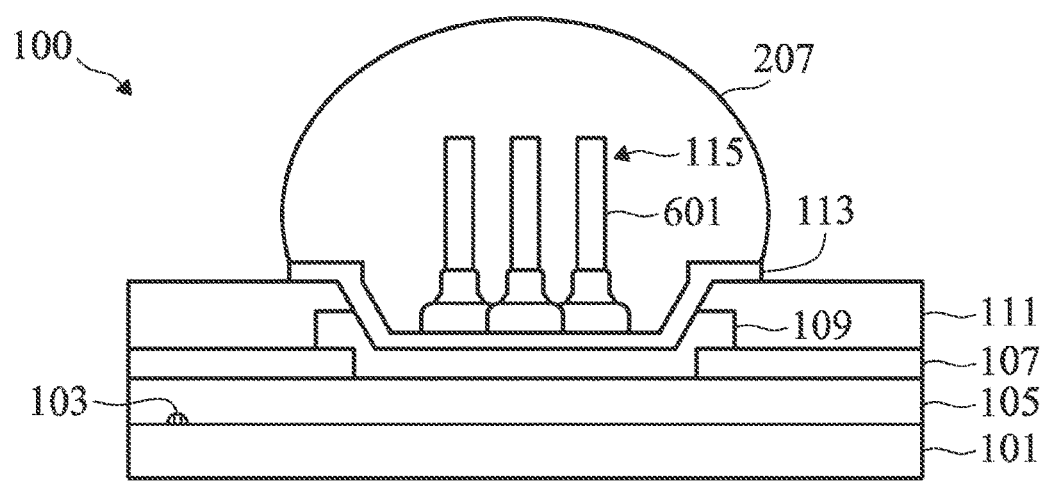

FIGS. 6A and 6B illustrate an alternative process which may be utilized to form the solid cylindrical crack stoppers 407, 409, and 411 in FIG. 4C or which may be used to form the solid cylindrical crack stoppers 407 through 523 in FIG. 5C. In this embodiment a wire 601 comprising a material such as copper, gold, or aluminum, combinations of these, or the like may be bonded to the UBM 113 or, if the UBM 113 is not desired, the wire 601 may be directly bonded to the first contact pad 109. The wire 601 may be bonded to the UBM 113 or the first contact pad 109 in the desired shape (e.g., a solid cylinder) using, for example, a wire bonding process. Once the wire 601 has been bonded to the UBM 113 in a ball shape or wedge shape, the wire length which is perpendicular to the UBM pad may be cut to a desired length such as between about 100 μm and about 300 μm, such as about 200 μm, using an EFO (electronic flame off) or a scissor or other type of blade cutting mechanism.

In an embodiment the wire 601 may be coated with a protective layer 603 (not individually shown in FIGS. 6A-6B). The protective layer 603 may be protective material such as palladium, nickel, gold, combinations of these, or the like, and may be placed on the wire 601 by the manufacturer prior to the wire 601 being bonded to the UBM 113, or may alternatively be placed on the wire 601 after the wire 601 has been bonded and cut to the desired length. In an embodiment the protective layer 603 may be formed through an electroplating process, an electroless plating process, or the like, although any suitable process may be utilized to protect the wire 601.

In accordance with an embodiment, a semiconductor device comprising a conductive pad on a substrate is provided. A first crack stopper extends from the conductive pad, the first crack stopper having a ring shape and being located along an exterior region of the conductive layer.

In accordance with another embodiment, a semiconductor device comprising an underbump metallization on a substrate is provided. The underbump metallization comprises a center region and an exterior region surrounding the center region. A first crack stopper is on the underbump metallization in the exterior region, the first crack stopper having a first circular shape.

In accordance with yet another embodiment, a semiconductor device comprising a conductive region on a first semiconductor substrate and a first crack stopper on the conductive region is provided. The first crack stopper comprises a wire that is wire bonded to the conductive region on the first semiconductor substrate Although the embodiments and their advantages have been described in detail, it should be understood that various changes, substitutions and alterations can be made herein without departing from the spirit and scope of the embodiments as defined by the appended claims. For example, the materials and methods of formation of the crack stoppers may be modified while remaining within the scope of the embodiments. Additionally, the precise shape of the crack stoppers may be adjusted in order to help prevent or reduce the propagation of cracks.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a first contact pad on a first semiconductor substrate;
   a first crack stopper on the first contact pad, the first crack stopper comprising a first wire that is wire bonded to the first contact pad on the first semiconductor substrate, the first wire having a first portion directly bonded to the first contact pad, the first portion having non-parallel sidewalls comprising a ball or wedge shape at an interface with the first contact pad, the first wire having a second portion continuous with the first portion, the second portion having parallel sidewalls extending from the first portion, the second portion being narrower than the first portion;
   a protective layer surrounding sides of the first wire; and
   solder surrounding the first crack stopper.

2. The semiconductor device of claim 1, wherein the first wire comprises a cylindrical shape.

3. The semiconductor device of claim 1, wherein the first contact pad is an underbump metallization.

4. A semiconductor device comprising:
   metallization layers over a substrate;
   a contact pad electrically connected to the metallization layers;
   an underbump metallization in physical contact with the contact pad, the underbump metallization having an upper level and a lower level;
   a first crack stopper bonded to the upper level of the underbump metallization, the first crack stopper being bonded by wire bonding;
   a second crack stopper bonded to the lower level of the underbump metallization, the second crack stopper being bonded by wire bonding, wherein being bonded by wire bonding provides that each of the first crack stopper and second crack stopper comprises a wire directly bonded to the underbump metallization, the wire having a ball or wedge shape portion comprising non-parallel sidewalls at an interface with the underbump metallization and a solid cylindrical shape portion comprising parallel sidewalls extending away from the ball or wedge shape portion and the interface with the underbump metallization, the solid cylindrical shape portion being narrower than the ball or wedge shape portion;
   solder encapsulating the first crack stopper; and
   a protective layer located between the first crack stopper and the solder.

5. The semiconductor device of claim 4, wherein the protective layer comprises palladium.

6. The semiconductor device of claim 4, wherein the first crack stopper comprises gold.

7. The semiconductor device of claim 4, wherein the first crack stopper has a length of about 200 μm.

8. A semiconductor device, comprising:
an underbump metallization overlying and electrically coupled to a substrate, the underbump metallization having a first portion at a periphery of the underbump metallization, the underbump metallization having a second portion at a middle of the underbump metallization, wherein the first portion is further from the substrate than the second portion; and
a first crack stopper bonded to the underbump metallization, the first crack stopper comprising a first structure formed on the first portion of the underbump metallization and a second structure formed on the second portion of the underbump metallization, wherein the first structure comprises a wire which is wire bonded to the first portion or the second portion, wherein the wire comprises a first section and a second section, the first section having non-parallel sidewalls comprising a ball or wedge shape, the second section having parallel sidewalls extending from the first section, the first section being wider than the second section, the first section being directly bonded to the first portion or the second portion;
a protective layer surrounding sides of the wire of the first structure; and
an interconnect encapsulating the first crack stopper, the interconnect electrically coupling the underbump metallization to a second device.

9. The semiconductor device of claim 8, wherein the first crack stopper comprises a first region proximal the underbump metallization and a second region distal the underbump metallization, wherein a width of the first region is greater than a width of the second region.

10. The semiconductor device of claim 1, wherein the first wire has a first height of between 1100 and 300 μm.

11. The semiconductor device of claim 1, wherein the first crack stopper further comprises a second wire that is wire bonded to the first contact pad, the second wire having a same shape as the first wire.

12. The semiconductor device of claim 1, wherein the solder electrically couples the first contact pad to a second contact pad.

13. The semiconductor device of claim 12, wherein the second contact pad has a second crack stopper disposed thereon.

14. The semiconductor device of claim 1, wherein an end of the first wire is free from the protective layer.

15. The semiconductor device of claim 4, wherein the protective layer surrounds sides of the first crack stopper, wherein the first crack stopper comprises a first material composition, wherein the protective layer comprises a second material composition different from the first material composition, wherein the first material composition is in contact with the solder at an end of the first crack stopper.

16. The semiconductor device of claim 8, wherein an end of the wire of the first structure is free from the protective layer.

17. The semiconductor device of claim 8, wherein the first structure is wire-bonded to the first portion, and wherein the second structure of the first crack stopper comprises a first hollow structure bonded to the underbump metallization.

18. The semiconductor device of claim 8, wherein the first structure is wire-bonded to the second portion, and wherein the second structure of the first crack stopper comprises a first hollow structure bonded to the underbump metallization.

19. The semiconductor device of claim 4, wherein the solder electrically couples the first contact pad to a second contact pad, wherein the second contact pad has a second crack stopper disposed thereon.

20. The semiconductor device of claim 8, wherein the interconnect electrically couples the underbump metallization to a contact pad of the second device; and wherein the contact pad has a second crack stopper disposed thereon.

* * * * *